(12) United States Patent
Le Mercier et al.

(10) Patent No.: US 10,593,817 B2
(45) Date of Patent: Mar. 17, 2020

(54) MIXED OXIDES AND SULPHIDES OF BISMUTH AND SILVER FOR PHOTOVOLTAIC USE

(71) Applicants: RHODIA OPERATIONS, Paris (FR); LE CENTRE NATIONAL DE LA RECHERCHE SCIENTIFIQUE, Paris (FR)

(72) Inventors: Thierry Le Mercier, Rosny Sous Bois (FR); Philippe Barboux, L'hay les Roses (FR); Tangui Le Bahers, Lyons (FR)

(73) Assignees: RHODIA OPERATIONS, Paris (FR); LE CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 0 days.

(21) Appl. No.: 15/301,494

(22) PCT Filed: Apr. 3, 2015

(86) PCT No.: PCT/EP2015/097024
§ 371 (c)(1),
(2) Date: Oct. 3, 2016

(87) PCT Pub. No.: WO2015/150592
PCT Pub. Date: Oct. 8, 2015

(65) Prior Publication Data
US 2017/0110605 A1    Apr. 20, 2017

(30) Foreign Application Priority Data
Apr. 4, 2014 (FR) ...................... 14 00833

(51) Int. Cl.
*H01L 31/032* (2006.01)
*C01G 29/00* (2006.01)
(Continued)

(52) U.S. Cl.
CPC .......... *H01L 31/032* (2013.01); *C01G 29/006* (2013.01); *H01L 31/072* (2013.01);
(Continued)

(58) Field of Classification Search
None
See application file for complete search history.

(56) References Cited

U.S. PATENT DOCUMENTS

| 2013/0287976 | A1* | 10/2013 | Palumbo | B32B 15/02 428/34.1 |
| 2014/0367721 | A1* | 12/2014 | Mahler | B82Y 30/00 257/98 |
| 2015/0221794 | A1* | 8/2015 | Le Mercier | H01G 9/2027 136/264 |

FOREIGN PATENT DOCUMENTS

| WO | 2010024500 A1 | 3/2010 |
| WO | 2014049172 A2 | 4/2014 |

OTHER PUBLICATIONS

Suppression of superconductivity in layered Bi4O4S3 by Ag doping, Tan et al., Physics of Condensed Matter, Aug. 2012 (Year: 2012).*

(Continued)

*Primary Examiner* — Shannon M Gardner

(57) ABSTRACT

The invention relates to a material comprising at least one compound having formula $Bi_{1-x}M_xAg_{1-y-\epsilon}M'_yOS_{1-z}M''_z$, the methods for producing said material and the use thereof as a semiconductor, such as for photovoltaic or photochemical use and, in particular, for supplying a photocurrent. The invention further relates to photovoltaic devices using said compounds.

15 Claims, 2 Drawing Sheets

(51) Int. Cl.
*H01L 31/072* (2012.01)
*H01L 51/00* (2006.01)
*H01L 51/42* (2006.01)

(52) U.S. Cl.
CPC ...... *H01L 51/0035* (2013.01); *H01L 51/0037* (2013.01); *H01L 51/4226* (2013.01); *H01L 51/4233* (2013.01); *C01P 2004/61* (2013.01); *C01P 2004/62* (2013.01); *C01P 2006/40* (2013.01); *Y02E 10/50* (2013.01)

(56) References Cited

OTHER PUBLICATIONS

Robert M. Pasquarelli, David S. Ginley, Ryan O'Hayre, "Solution processing of transparent conductors: from flask to film", Chem. Soc. Rev., 2011, vol. 40, pp. 5406-5441.

* cited by examiner

MIXED OXIDES AND SULPHIDES OF BISMUTH AND SILVER FOR PHOTOVOLTAIC USE

This application is a U.S. national phase entry under 35 U.S.C. § 371 of International Application No. PCT/EP2015/097024, filed on Apr. 3, 2015, which claims priority to French Application No. 14/00833, filed on Apr. 4, 2014. The entire contents of these applications are explicitly incorporated herein by this reference.

The present invention relates to the field of inorganic semiconductor compounds intended in particular for providing a photocurrent, especially via a photovoltaic effect.

Nowadays, photovoltaic technologies using inorganic compounds are mainly based on silicon technologies (more than 80% of the market) and on "thin layer" technologies (mainly CdTe and CIGS (Copper Indium Gallium Selenium), representing 20% of the market). The growth of the photovoltaic market appears to be exponential (40 GW cumulative in 2010, 67 GW cumulative in 2011).

Unfortunately, these technologies suffer from drawbacks that limit their capacity to satisfy this growing market. These drawbacks include poor flexibility as regards silicon from a mechanical and installation viewpoint, and the toxicity and scarcity of the elements for the "thin layer" technologies. In particular, cadmium, tellurium and selenium are toxic. Moreover, indium and tellurium are rare, which has an impact especially on their cost.

For these reasons, it is sought to dispense with the use of indium, cadmium, tellurium and selenium or to reduce their proportion.

One route that has been recommended for replacing indium in CIGS is to replace it with the couple ($Zn^{2+}$, $Sn^{4+}$). In this context, the compound $Cu_2ZnSnSe_4$ (known as CZTS) has especially been proposed. This material is nowadays considered as being the most serious successor to CIGS in terms of efficacy, but has the drawback of the toxicity of selenium.

As regards selenium and tellurium, few substitution solutions have been proposed, and they generally prove to be disadvantageous. Compounds such as SnS, $FeS_2$ and $Cu_2S$ have indeed been tested, but, although they have advantageous intrinsic properties (gap, conductivity, etc.), they do not prove to be sufficiently chemically stable (e.g.: $Cu_2S$ is very readily transformed into $Cu_2O$ on contact with air and moisture).

To the inventors' knowledge, no satisfactory solution for obtaining good photovoltaic efficacy without problems associated with the toxicity and/or scarcity of the elements used in a photovoltaic system has been published to date.

One aim of the present invention is, precisely, to provide alternative inorganic compounds to those used in the current photovoltaic technologies, which make it possible to avoid the abovementioned problems.

To this end, the present invention proposes using a novel family of inorganic materials, for which the inventors have now demonstrated, surprisingly, that they prove to have good efficacy, and that they have the advantage of not needing to use, or of using in a very low content, rare or toxic metals such as the abovementioned In, Te or Cd, and also offer the possibility of using anions, such as Se or Te in a reduced content, or even of not using anions of this type.

One of the subjects of the present invention is a novel material comprising at least one compound of formula (I):

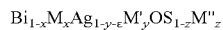

$$Bi_{1-x}M_xAg_{1-y-\varepsilon}M'_yOS_{1-z}M''_z \quad (I)$$

in which:

M is an element or a mixture of elements chosen from group (A) consisting of Pb, Sn, Hg, Ca, Sr, Ba, Sb, In, Tl, Mg, rare earth metals, M' is an element or a mixture of elements chosen from group (B) consisting of Ti, V, Cr, Mn, Fe, Co, Ni, Cu, Zn, Ga, Al, Cd, Pt, Pd, M" is a halogen, x, y and z are numbers less than 1, in particular less than 0.6, especially less than 0.5, for example less than 0.2, $0 \le \varepsilon \le 0.2$.

When they are present, the elements M, M' and M" are generally substitution elements occupying, respectively, the place of the element Bi, of the element Ag and of the element S.

The term "material comprising at least one compound of formula (I)" means a solid, generally in divided form (powder or dispersion) or in the form of a coating or of a continuous or discontinuous layer on a support, and which comprises, or even consists of, a compound corresponding to formula (I).

The term "rare earth metal" means the elements from the group consisting of yttrium and scandium and the elements of the Periodic Table with an atomic number of between 57 and 71 inclusive.

According to a first embodiment, the numbers x, y and z are zero (x=y=z=0). Thus, the compound of formula (I) according to the invention corresponds to the following formula: $BiAg_{1-\varepsilon}OS$.

According to a second embodiment of the invention, at least one of the numbers x, y or z is not zero.

According to this second embodiment of the invention, the element M may preferably be chosen from the elements Sb, Pb, Ba and rare earth metals. The element M may, for example, be lutetium.

The element M' may preferably be chosen from the elements Cu, Zn, Mn. The element M' may, for example, be the element Cu.

The element M" may especially be the element I.

In a first variant of this second embodiment of the invention, the compound of formula (I) according to the invention corresponds to the following formula: $Bi_{1-x}M_xAg_{1-\varepsilon}OS$ ($I_a$), in which x≠0, ε is a zero or non-zero number and M is an element or a mixture of elements chosen from group (A) consisting of Pb, Sn, Hg, Ca, Sr, Ba, Sb, In, Tl, Mg, rare earth metals.

According to one embodiment of this variant of the invention, M is an element or a mixture of elements chosen from rare earth metals.

The compound may then correspond, for example, to the formula $Bi_{1-x}Lu_xAgOS$ in which x≠0 and ε=0.

In a second variant of the invention, the compound of formula (I) according to the invention corresponds to the following formula: $BiAg_{1-y-\varepsilon}M'_yOS$ ($I_b$), in which y≠0, ε is a zero or non-zero number and M' is an element or a mixture of elements chosen from group (B) consisting of by Ti, V, Cr, Mn, Fe, Co, Ni, Cu, Zn, Ga, Al, Cd, Pt, Pd.

According to one embodiment of this variant of the invention, M' is an element or a mixture of elements chosen from the elements Cu and Zn.

The compound may then correspond, for example, to the formula $BiAg_{1-y}Cu_yOS$ or to the formula $BiAg_{1-y}Zn_yOS$ in which y≠0 and ε=0.

In a third variant of the invention, the compound of formula (I) according to the invention corresponds to the following formula: $BiAgOS_zM''_{1-z}$ ($I_c$), in which z≠0, ε is a zero or non-zero number and M" is a halogen.

According to one embodiment of this variant of the invention, M″ is the element I, and the compound then corresponds to the formula $BiAgOS_zI_{1-z}$ in which $z\neq0$ and $\varepsilon=0$.

A subject of the invention is also a process for preparing the material according to the invention, comprising a step of solid milling of a mixture comprising at least inorganic compounds of bismuth and silver, and optionally at least one oxide, sulfide, oxysulfide, halide or oxyhalide of at least one element chosen from Bi and elements from group (A) consisting of Pb, Sn, Hg, Ca, Sr, Ba, Sb, In, Tl, Mg, rare earth metals, and optionally at least one oxide, sulfide, oxysulfide, halide or oxyhalide of at least one element chosen from Ag and elements from group (B) consisting of Ti, V, Cr, Mn, Fe, Co, Ni, Cu, Zn, Ga, Al, Cd, Pt, Pd.

According to the invention, a mixture in solid form comprising at least inorganic compounds of bismuth and silver is milled. Preferably, the inorganic compounds of bismuth and silver present in the mixture are at least the compounds $Bi_2O_3$, $Bi_2S_3$ and $Ag_2S$.

This milling may be performed according to any means known per se. This mixture may especially be placed in an agate mortar. The milling may be performed, for example, with a planetary mill.

To facilitate the milling, it is possible to add to the mixture in solid form milling beads that consist, for example, of stainless-steel beads, special chromium steel beads, agate beads, tungsten carbide beads or zirconium oxide beads.

The milling time may be adjusted according to the desired product. It may especially be between 20 minutes and 96 hours, especially between 1 hour and 72 hours.

The inorganic compounds of bismuth and silver in the mixture may be in the form of particles with a particle size of less than 50 μm, in particular less than 10 μm, for example less than 1 μm.

The dimensions of the particles to which reference is made here may typically be measured by scanning electron microscopy (SEM).

A subject of the present invention is also the use of a material comprising at least one compound of formula (I):

$$Bi_{1-x}M_xAg_{1-y-\varepsilon}M'_yOS_{1-z}M''_z \qquad (I)$$

in which:

M is an element or a mixture of elements chosen from group (A) consisting of Pb, Sn, Hg, Ca, Sr, Ba, Sb, In, Tl, Mg, rare earth metals, M' is an element or a mixture of elements chosen from group (B) consisting of Ti, V, Cr, Mn, Fe, Co, Ni, Cu, Zn, Ga, Al, Cd, Pt, Pd, M″ is a halogen, x, y and z are numbers less than 1, in particular less than 0.6, especially less than 0.5, for example less than 0.2, and $0\leq\varepsilon\leq0.2$ as semiconductor, especially for photoelectrochemical or photochemical application, in particular for providing a photocurrent.

That which is indicated in the above presentation, especially as regards the elements M, M' and M″ and the numbers x, y and z, applies to the present use according to the invention.

The compound that is present in the semiconductor material is a substituted inorganic material, especially of the p type.

The chemical substitutions of bismuth, silver and/or sulfur may have several roles.

In the case of isoelectronic substitutions such as substitution of the element Bi with rare earth metals or with the element Sb or alternatively substitution of the element Ag with the element Cu, these substitutions may, especially by modifying the lattice parameters and/or by modifying the extension of the orbitals and their energetic position, thus lead to modifications of the gap (valency band-conduction band).

As regards aliovalent substitutions, they modify the oxidation state of the element Ag.

The introduction of substituents into the structure of the semiconductor may, depending on the case, lead to a reduction or an increase in the number of charge carriers. The substituted materials may especially have higher conductivity, which induces improved conduction capacity, relative to its unsubstituted form, or, on the contrary, lower conductivity.

In the context of the present invention, the inventors have now demonstrated that the materials corresponding to the abovementioned formula (I), in particular when they are of p type, are capable of providing a photocurrent when they are irradiated at a wavelength longer than their gap (namely the generation of an electron-hole pair in the material under the effect of an incident photon of sufficient energy, the charged species formed (the electron and the "hole", namely the absence of an electron) being free to move to generate a current).

In particular, the inventors have now demonstrated that the materials of the invention appear to be capable of producing a photovoltaic effect.

In general, a photovoltaic effect is obtained via the combined use of two semiconductor compounds of different type, namely:

a first compound having semiconductor nature of p type; and a second compound having semiconductor nature of n type.

These compounds are placed close to each other in a manner known per se (i.e. in direct contact or at the very least at a distance that is small enough to ensure the photovoltaic effect) to form a junction of p-n type. The electron-hole pairs created by light absorption are dissociated at the p-n junction and the excited electrons may be conveyed by the n-type semiconductor to the anode, the holes being, themselves, conveyed to the cathode via the p-type semiconductor.

In the context of the invention, the photovoltaic effect is typically obtained by placing a semiconductor-based material of the abovementioned formula (I), which is also specifically of p type, in contact with an n-type semiconductor between two electrodes, in direct contact or optionally connected to at least one of the electrodes via an additional coating, for example a charge collector coating; and by irradiating the photovoltaic device thus made with suitable electromagnetic radiation, typically with light from the solar spectrum. To do this, it is preferable for one of the electrodes to allow passage of the electromagnetic radiation used.

According to another particular aspect, a subject of the present invention is photovoltaic devices comprising, between a hole-conducting material and an electron-conducting material, a layer based on a p-type compound of formula (I) and a layer based on an n-type semiconductor, in which:

the layer based on the compound of formula (I) is in contact with the layer based on the n-type semiconductor;

the layer based on the compound of formula (I) is close to the hole-conducting material; and the layer based on the n-type semiconductor is close to the electron-conducting material.

For the purposes of the present description, the term "hole-conducting material" means a material which is capable of circulating current between the p-type semiconductor and the electrical circuit.

The n-type semiconductor used in the photovoltaic devices according to the invention may be chosen from any semiconductor which has more pronounced electron-acceptor nature than the compound of formula (I) or a compound which promotes the removal of electrons. Preferably, the n-type semiconductor may be an oxide, for example ZnO or $TiO_2$, or a sulfide, for example ZnS.

The hole-conducting material used in the photovoltaic devices according to the invention may be, for example, a suitable metal, for instance gold, tungsten or molybdenum; or a metal deposited on a support, or in contact with an electrolyte, such as Pt/FTO (platinum deposited on fluorine-doped tin dioxide); or a conductive oxide such as ITO (tin-doped indium oxide), for example deposited on glass; or a p-type conductive polymer.

According to a particular embodiment, the hole-conducting material may comprise a hole-conducting material of the abovementioned type and a redox mediator, for example an electrolyte containing the $I_2/I^-$ couple, in which case the hole-conducting material is typically Pt/FTO.

The electron-conducting material may be, for example, FTO or AZO (aluminum-doped zinc oxide), or an n-type semiconductor.

In a photovoltaic device according to the invention, the holes generated at the p-n junction are extracted via the hole-conducting material and the electrons are extracted via the electron-conducting material of the abovementioned type.

In a photovoltaic device according to the invention, it is preferable for the hole-conducting material and/or the electron-conducting material to be a material that is at least partially transparent, which allows passage of the electromagnetic radiation used. In this case, the at least partially transparent material is advantageously placed between the source of the incident electromagnetic radiation and the p-type semiconductor.

To this end, the hole-conducting material may be, for example, a material chosen from a metal or a conductive glass.

Alternatively or in combination, the electron-conducting material may be at least partially transparent, and it is then chosen, for example, from FTO (fluorine-doped tin dioxide), or AZO (aluminum-doped zinc oxide), or an n-type semiconductor.

According to another advantageous embodiment, the layer based on an n-type semiconductor which is in contact with the layer based on a p-type compound of formula (I) may also be at least partially transparent.

The term "partially transparent material" means here a material which allows the passage of at least part of the incident electromagnetic radiation, useful for providing the photocurrent, and which may be:
   a material that does not totally absorb the incident electromagnetic field; and/or
   a material that is in a perforated form (typically comprising holes, slits or interstices) capable of allowing the passage of part of the electromagnetic radiation without this radiation encountering the material.

The compound of formula (I) used according to the present invention is advantageously used in the form of isotropic or anisotropic objects having at least one dimension of less than 50 µm, preferably less than 20 µm, typically less than 10 µm, preferentially less than 5 µm, generally less than 1 µm, more advantageously less than 500 nm, for example less than 200 nm, or even 100 nm.

Typically, the dimension less than 50 µm may be:
   the mean diameter in the case of isotropic objects;
   the thickness or the transverse diameter in the case of anisotropic objects.

According to a first variant, the objects based on a compound of formula (I) are particles, typically having dimensions of less than 10 µm.

These particles are preferably obtained according to one of the preparation processes of the invention.

The term "particles" means herein isotropic or anisotropic objects, which may be individual particles, or aggregates.

The dimensions of the particles to which reference is made here may typically be measured by scanning electron microscopy (SEM).

Advantageously, the compound of formula (I) is in the form of anisotropic particles of platelet type, or of agglomerates of a few dozen to a few hundred particles of this type, these platelet-type particles typically having dimensions that remain less than 5 µm (preferentially less than 1 µm, more advantageously less than 500 nm), with a thickness that typically remains less than 500 nm, for example less than 100 nm.

The particles of the type described according to the first variant may typically be used in the form deposited on an n-type conductive or semiconductor support.

An ITO or metal plate covered with p-type particles of formula (I) according to the invention may thus, for example, act as a photoactive electrode for a device of photoelectrochemical type that may be used especially as a photodetector.

Typically, a device of photoelectrochemical type using a photoactive electrode of the abovementioned type comprises an electrolyte that is generally a salt solution, for example a KCl solution, typically having a concentration of about 1 M, in which are immersed:
   a photoactive electrode of the abovementioned type (ITO or metal plate covered with particles of compound of formula (I) according to the invention);
   a reference electrode; and
   a counter-electrode;
these three electrodes being linked together, typically via a potentiostat.

According to a possible embodiment, the electrochemical device may comprise:
   as photoactive electrode: a support (such as an ITO plate) covered with particles of compound of formula (I);
   as reference electrode: for example, an Ag/AgCl electrode; and
   as counter-electrode: for example, a platinum wire;
these three electrodes being linked together, typically via a potentiostat.

When an electrochemical device of this type is placed under a light source, under the effect of irradiation, electron-hole pairs form and are dissociated.

When the electrolyte is an aqueous solution, which is usually the case, the water in the electrolyte is reduced close to the photoactive electrode by the electrons generated, producing hydrogen and $OH^-$ ions. The $OH^-$ ions thus produced will migrate toward the counter-electrode via the electrolyte; and the holes of the compound of formula (I) will be extracted via the ITO-type conductor and will enter in the external electrical circuit. Finally, oxidation of the $OH^-$ ions is performed using holes close to the counter-electrode, producing oxygen. The placing in motion of these charges (holes and electrons), induced by the absorption of light by the compound of formula (I), generates a photocurrent.

The device may especially be used as a photodetector, the photocurrent being generated only when the device is illuminated.

A photoactive electrode as described above may especially be prepared using a suspension, comprising particles of a compound of formula (I) of the abovementioned type dispersed in a solvent, and depositing this suspension on a support, for example a glass plate covered with ITO or a metal plate, via the wet route or any coating method, for example by drop-casting, spin-coating, dip-coating, ink-jet printing or screen printing. For further details regarding this subject, reference may be made to the article: R. M. Pasquarelli, D. S. Ginley, R. O'Hayre, in *Chem. Soc. Rev.*, vol 40, pages 5406-5441, 2011. Preferably, the particles based on a compound of formula (I) which are present in the suspension have a mean diameter as measured by laser granulometry (for example using a Malvern type laser granulometer) which is less than 5 μm.

According to a preferential embodiment, the particles of compound of formula (I) may be previously dispersed in a solvent, for example terpineol or ethanol.

The suspension containing the particles of compound of formula (I) may be deposited on a support, for example a plate covered with conductive oxide.

According to a second variant of the invention, which proves to be well suited to producing photovoltaic devices, the compound of formula (I) is in the form of a continuous layer based on the compound of formula (I), whose thickness is less than 50 μm, preferably less than 20 μm, more advantageously less than 10 μm, for example less than 5 μm and typically greater than 500 nm.

The term "continuous layer" means herein a homogeneous deposit produced on a support and covering said support, not obtained by simple deposition of a dispersion of particles onto the support.

The continuous layer based on a p-type compound of formula (I) according to this particular variant of the invention is typically placed close to a layer of an n-type semiconductor, between a hole-conducting material and an electron-conducting material, to form a photovoltaic device intended to provide a photovoltaic effect.

An n-type semiconductor in the use according to the invention may be a conductive oxide, for example ZnO or $TiO_2$, or a sulfide, for example ZnS.

Moreover, the term layer "based on the compound of formula (I)" means a layer comprising the compound of formula (I), preferably in a proportion of at least 50% by mass, or even in a proportion of at least 75% by mass.

According to one embodiment, the continuous layer according to the second variant is essentially constituted by the compound of formula (I), and it typically comprises at least 95% by mass, or even at least 98% by mass and more preferentially at least 99% by mass of the compound of formula (I).

The continuous layer based on a compound of formula (I) used according to this embodiment may take several forms.

The continuous layer may especially comprise a polymer matrix and, dispersed in this matrix, particles based on a compound of formula (I), typically with dimensions of less than 10 μm, or even less than 5 μm, especially of the type used in the first embodiment of the invention.

Typically, the polymer matrix comprises a p-type conductive polymer, which may be chosen especially from polythiophene derivatives, more particularly from poly(3,4-ethylenedioxythiophene):poly(styrenesulfonate) (PEDOT:PSS) derivatives.

The particles based on the compound of formula (I) present in the polymer matrix preferably have dimensions of less than 5 μm, which may especially be determined by SEM.

The invention will now be illustrated in greater detail with reference to the illustrative examples given below and to the attached figures, in which.

Figure 1:
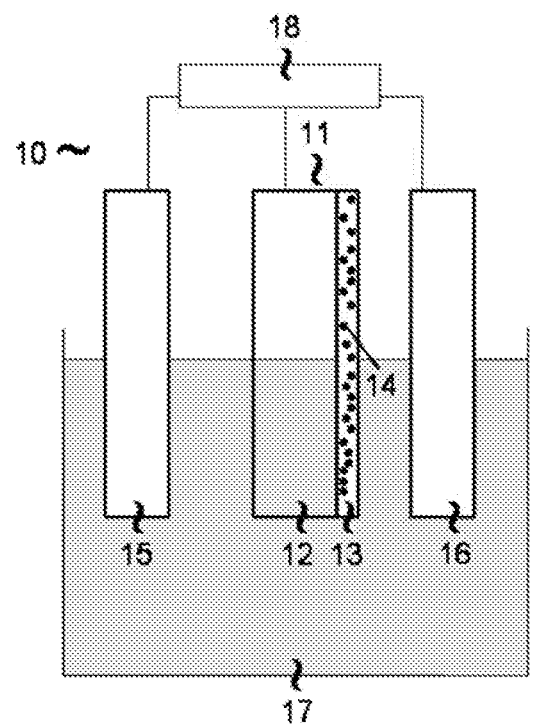
FIG. 1 is a schematic representation in cross section of a photoelectrochemical cell used in example 4 described below.

FIG. 1 shows a photoelectrochemical cell 10 which comprises:
  a photoactive electrode 11 consisting of a support 12 based on a glass covered with a conductive layer of ITO of 2 cm×1 cm onto which has been deposited over the entire surface a layer 13 about 1 μm thick based on particles 14 of a compound of formula (I) according to the invention, the particles 14 were previously dispersed in terpineol and then deposited by coating (doctor blade coating) onto the conductive glass plate 11;
  an (Ag/AgCl) reference electrode 15; and
  a counter-electrode (platinum wire) 16.

The three electrodes 11, 15 and 16 are immersed in an electrolyte 17 of 1M KCl. The three electrodes are linked via a potentiostat 18.

Figure 2:
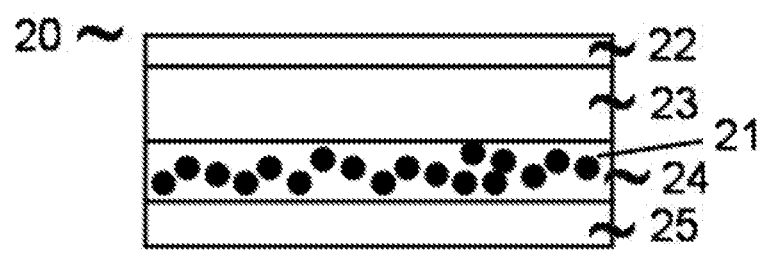
FIG. 2 is a schematic representation in cross section of a photodetector device.

FIG. 2 shows a photodetector device 20 which comprises particles 21 of a compound of formula (I) according to the invention. This device comprises an FTO layer 22 about 500 nm thick onto which is electro-deposited a layer 23 about 1 μm thick based on ZnO. Layer 24 about 1 μm thick based on particles 21 of a compound of formula (I) according to the invention is deposited on the surface of layer 23 by deposition of the drops from a suspension of particles of a compound of formula (I) according to the invention at 25-30% by mass in ethanol. A gold layer 25 about 1 μm thick is deposited on layer 24 by evaporation.

Figure 3:
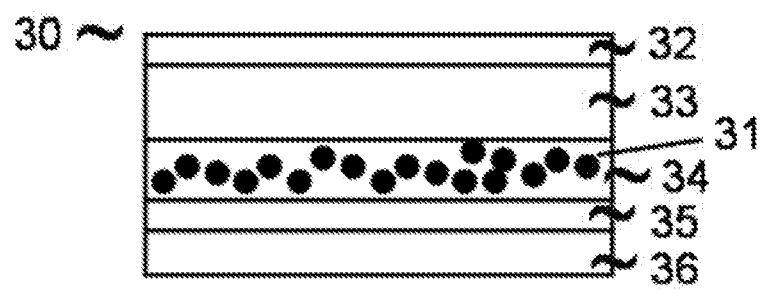
FIG. 3 is a schematic representation in cross section of a photovoltaic device.

FIG. 3 shows the photovoltaic device 30 which comprises particles 31 of a compound of formula (I) according to the invention. This device comprises an FTO layer 32 about 500 nm thick onto which is electro-deposited a layer 33 about 1 μm thick based on ZnO. Layer 34 about 1 μm thick based on particles 31 of a compound of formula (I) according to the invention is deposited on the surface of layer 33 by deposition of the drops from a suspension of particles of formula (I) according to the invention at 25-30% by mass in ethanol. An electrolyte containing the $I_2/I^-$ couple 35 serving as redox mediator is deposited by deposition of the drops onto the surface of layer 34, and on which a gold layer 36 about 1 μm thick is deposited by evaporation.

Figure 4:
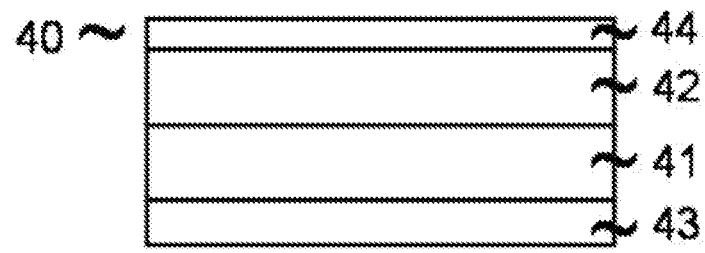
FIG. 4 is a schematic representation in cross section of a photovoltaic device according to the invention, not exemplified.

FIG. 4 shows the photovoltaic device 40 which comprises a layer 41 based on particles of a compound of formula (I) according to the invention deposited onto a layer 42 based on ZnO by coating, layer 42 based on ZnO being prepared by sol-gel deposition, layer 41 being in contact with a gold layer 43 and layer 42 based on ZnO being in contact with an FTO layer 44.

The placing in contact of a compound of formula (I) according to the invention with an n-type semiconductor ZnO forms a p-n junction. When the device is placed under a light source, the electrons generated move into the ZnO and the holes generated remain in the compound of formula (I) according to the invention. The ZnO is in contact with FTO (electron conductor) to extract the electrons therefrom and the compound of formula (I) according to the invention is in contact with gold (hole conductor) to extract the holes therefrom.

The examples that follow illustrate the invention without, however, limiting the scope.

EXAMPLES

Example 1

Process for Preparing BiAgOS Particles

A BiAgOS powder was prepared by reactive milling at room temperature, according to the following protocol:

0.685 g of $Bi_2S_3$, 1.243 g of $Bi_2O_3$ and 0.991 g of $Ag_2S$ are placed in an agate mortar in the presence of agate milling beads.

The mortar is then covered and placed in a Fritsch No. 6 planetary mill with a spin speed of about 500 rpm. Milling is continued for 120 minutes until a pure phase is obtained.

The compound $C_1$ obtained characterized by x-ray diffraction has the following tetragonal lattice parameters: a=3.92 Å, c=9.23 Å, V=141.7 Å$^3$.

Example 2

Use of Compound $C_1$ in a Photoelectrochemical Device

The device described in FIG. 1 was used, by polarizing the working electrode at a potential of −0.8 V vs Ag/AgCl. The system is irradiated under an incandescent lamp (whose color temperature is 2700 K) alternating periods of darkness and periods of light. The current intensity increased when the system was placed in light. This is a photocurrent measured at 100 µA·cm$^{-2}$, which confirms the capacity of the compound $C_1$ to generate a photocurrent. This photocurrent is cathodic (i.e. negative), which is in agreement with the fact that this compound $C_1$ is a p-type semiconductor.

The invention claimed is:

1. A material comprising at least one compound of formula (I): $BiAg_{1-\varepsilon}OS$, wherein $0 \leq \varepsilon \leq 0.2$.

2. A process for preparing the material according to claim 1, the process comprising solid milling a mixture comprising at least one of the inorganic compounds of bismuth and silver, and optionally at least one oxide, sulfide, oxysulfide, halide or oxyhalide of at least one element chosen from Bi and elements from group (A), and optionally at least one oxide, sulfide, oxysulfide, halide or oxyhalide of at least one element chosen from Ag and elements from group (B).

3. A semiconductor comprising the material according to claim 1.

4. The semiconductor according to claim 3, wherein the compound of formula (I) is in the form of isotropic or anisotropic objects having at least one dimension of less than 50 µm.

5. The semiconductor according to claim 4, wherein the compound of formula (I) is in the form of particles with dimensions of less than 10 µm.

6. The semiconductor according to claim 5, wherein the compound of formula (I) is in the form of anisotropic particles of platelet type, or of agglomerates of a few dozen to a few hundred particles of this type.

7. The semiconductor according to claim 4, wherein the compound of formula (I) is in a continuous layer based on the compound of formula (I) whose thickness is less than 50 µm, said layer comprising the compound of formula (I) in a proportion of at least 95% by mass.

8. The semiconductor according to claim 4, wherein the compound of formula (I) is in a continuous layer based on the compound of formula (I) whose thickness is less than 50 µm, said layer comprising a polymer matrix and, dispersed in this matrix, particles based on the compound of formula (I) with dimensions of less than 5 µm.

9. A photovoltaic device comprising, between a hole-conducting material and an electron-conducting material, a layer based on a p-type compound of formula (I) according to claim 1, and a layer based on an n-type semiconductor, in which:
the layer based on the p-type compound of formula (I) is in contact with the layer based on the n-type semiconductor;
the layer based on the p-type compound of formula (I) is close to the hole-conducting material; and
the layer based on the n-type semiconductor is close to the electron-conducting material.

10. The semiconductor according to claim 3, wherein the semiconductor is utilized for photoelectrochemical or photochemical application.

11. The semiconductor according to claim 10, wherein the semiconductor is utilized for providing a photocurrent.

12. The semiconductor according to claim 4, wherein the isotropic or anisotropic objects have at least one dimension of less than 20 µm.

13. The semiconductor according to claim 7, wherein thickness is less than 20 µm.

14. The semiconductor according to claim 8, wherein thickness is less than 20 µm.

15. The process of claim 2, wherein milling time is between 20 minutes and 96 hours.

* * * * *